United States Patent [19]
Cooney et al.

[11] Patent Number: 4,636,026
[45] Date of Patent: Jan. 13, 1987

[54] ELECTRICAL TEST PROBE

[75] Inventors: James S. Cooney, Attleboro; Stephen T. Sicard, Norton, both of Mass.

[73] Assignee: Augat Inc., Mansfield, Mass.

[21] Appl. No.: 811,707

[22] Filed: Dec. 20, 1985

[51] Int. Cl.$^4$ ............................................ H01R 13/15
[52] U.S. Cl. .......................... 339/255 R; 339/108 TP
[58] Field of Search ........................ 339/108 TP, 255

[56] References Cited
U.S. PATENT DOCUMENTS

| | | | |
|---|---|---|---|
| 2,894,205 | 7/1959 | Schrock et al. | 339/108 TP |
| 2,934,738 | 4/1960 | Abrams | 339/108 TP |
| 3,435,168 | 3/1969 | Cooney | 339/108 TP |

Primary Examiner—Joseph H. McGlynn
Attorney, Agent, or Firm—Weingarten, Schurgin, Gagnebin & Hayes

[57] ABSTRACT

An electrical test probe in which spring biasing of the probe plunger is provided by the cooperative action of one or more laterally deflectable spring fingers cooperative with one or more angled surfaces. The plunger includes a ramped surface or surfaces which are cooperative with one or more spring fingers of a spring assembly and which are laterally movable to urge the plunger to a normally outward position. Alternatively, the spring assembly can be part of the movable plunger with the ramped surface or surfaces being fixed. The spring probe can be contained within a sleeve or can be mounted directly within an opening of a circuit board or other mounting member.

19 Claims, 17 Drawing Figures

ELECTRICAL TEST PROBE

FIELD OF THE INVENTION

This invention relates to electrical contacts and more particularly to spring-loaded test probes.

BACKGROUND OF THE INVENTION

Electrical test probes having spring-loaded contact tips are employed in automatic circuit board and electronic circuit test systems and for other similar purposes in which electrical contact is made between a circuit or device and one or more test points. The spring probe generally comprises a metal sleeve having a plunger slidably disposed therein and having a helical coil spring surrounding the plunger and disposed within the sleeve for urging the plunger to a normally outward position. The outer plunger end includes a probe tip of intended configuration to contact an associated terminal of a circuit board or other device.

The coil spring has electrical resistance and inductance which for some purposes detracts from or impairs the electrical performance of the probe. The length of the probe is also governed by the intended length of the coil spring to provide the requisite spring action on the probe tip, and for some purposes the probe length is greater than desirable. The degree of spring action is not controllable in a spring probe employing a coil spring without altering the characteristics of the coil spring itself.

SUMMARY OF THE INVENTION

In brief, the present invention provides a spring probe in which the spring biasing of the probe plunger is provided by the cooperative action of one or more laterally deflectable spring fingers cooperative with one or more angled surfaces such that the plunger is biased to a normally outward position. In one presently preferred embodiment, the inner end of a plunger disposed within a sleeve terminates in a ramped surface or surfaces which may be a continuous cone or a faceted pyramidal shape. The lateral spring action is provided by one or more spring fingers which work against the ramped surface or surfaces. The spring probe provides good electrical contact with low resistance and low inductance and is capable of being fabricated in relatively short lengths by reason of the side acting springs.

The spring probe can be contained within a sleeve in which the plunger is slidably movable, and from which a lead extends to which electrical connection can be made. Alternatively, the spring probe can be mounted directly within an opening of a circuit board or other mounting member.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
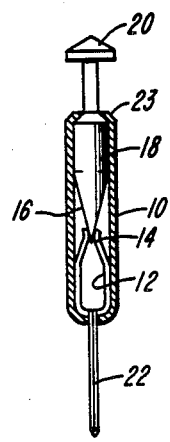
FIG. 1 is a cutaway elevation view of an embodiment of a test probe in accordance with the invention illustrated in its normal extended position.
Figure 2:
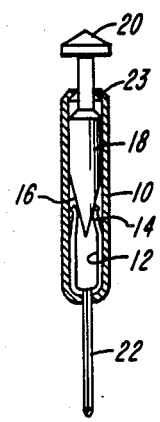
FIG. 2 is a cutaway elevation view of the embodiment of FIG. 1 illustrated in its biased inward position.

Referring to FIG. 1, there is shown a test probe in accordance with the invention which comprises a metal sleeve 10 having a spring or contact assembly 12 therein having a plurality of laterally deflectable contact spring fingers 14 which engage and are cooperative with the conical surface 16 of a plunger 18 which is slidably disposed in the sleeve. The plunger terminates in a contact tip 20 which can be of many different configurations to suit the intended purpose. The spring fingers are in a normally compressed state, as illustrated, causing the plunger to be in axially extended position. Upon inward movement of the plunger within the sleeve, shown in FIG. 2, as will be caused by the loading force on the plunger tip during use, the spring fingers 14 are laterally deflected by the conical surface 16 and cause a biasing force on the conical surface which is resolved into a longitudinal force component along the axis of the plunger to provide the intended spring action for the probe.

Figure 2A:
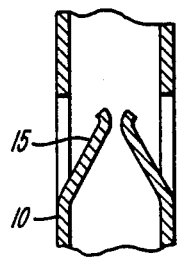
FIG. 2A is a cutaway elevation of an embodiment having spring fingers formed from the sleeve.

A lead 22 outwardly extends from the spring assembly and to which electrical connection is made for connecting the spring probe to external circuitry. The lead 22 can be of any convenient configuration for soldering, wire wrapping or other intended means of electrical connection. The sleeve in the illustrated embodiment is crimped at the upper end 23 to retain the plunger 18 slidably within the sleeve. It is contemplated that the sleeve can take a variety of configurations to contain a plunger and contact assembly in cooperative relation. The contact assembly can be separately fabricated and installed within a sleeve, as illustrated. Alternatively, the contact assembly can be formed integrally with the sleeve, as shown in FIG. 2A. Spring fingers 15 are formed and inwardly extend from the wall of the sleeve 10 and are cooperative with the ramp surface or surfaces of the plunger. The contact assembly can include one or more spring fingers, depending upon the desired spring force. For the conical plunger end as illustrated, the contact assembly typically includes three or more spring fingers symmetrically disposed about the conical surface.

The ramp angle and the coefficient of friction between the ramp and the one or more spring fingers can be selected to yield the intended bias force.

Figure 3:
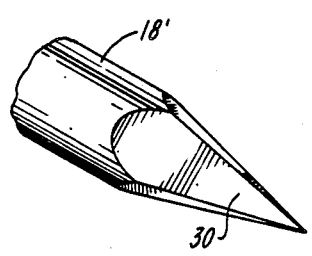
FIG. 3 is a cutaway elevation view of an alternative plunger configuration having multiple facets thereon.

The plunger can also be formed of pyramidal shape having faceted ramped surfaces. Referring to FIG. 3, the plunger 18 includes faceted flat surfaces 30 each of which coact with a respective spring finger 14 of the contact assembly to provide the intended spring loading of the plunger.

Figure 4:
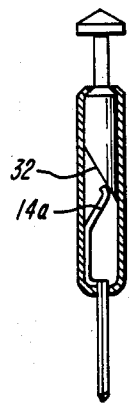
FIG. 4 is a sectional elevation view of a further embodiment in which the plunger has single ramp surface, and shown in extended position.
Figure 5:
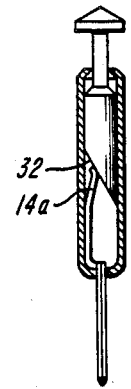
FIG. 5 is a sectional elevation view of the embodiment of FIG. 4 shown in the inward position.

An alternative embodiment is shown in FIGS. 4 and 5, wherein the plunger 18 includes a single ramp surface 32 cooperative with a single laterally deflectable spring finger 14a to provide the plunger loading.

Figure 6:
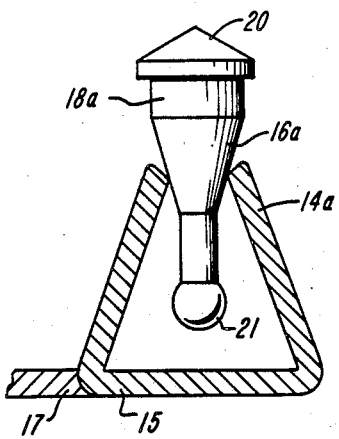
FIG. 6 is a sectional elevation view of another embodiment adapted for mounting directly in an opening of a mounting board.

The spring probe can also be mounted directly to a circuit board or other mounting member without use of a sleeve containing the plunger and contact assembly. Referring to FIG. 6, there is shown a spring assembly having a plurality of spring fingers extending from a band 15 which is inserted into a mounting opening of a board 17. The plunger 18a has a conical surface 16a cooperative with the ends of the spring fingers 14a, a contact tip 20 at the outer end thereof and a bulbous inner end 21 which serves as a stop to prevent the plunger from being easily removed from the spring assembly.

Figure 7:
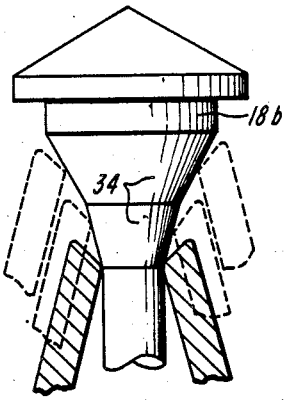
FIG. 7 is a cutaway elevation view illustrating an alternative plunger configuration providing nonlinear force.
Figure 8:
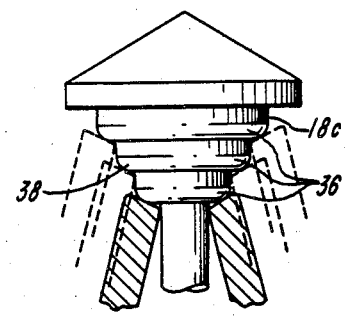
FIG. 8 is a cutaway elevation view of a further plunger configuration providing nonuniform plunger force.

The ramped surface or surfaces of the plunger can be shaped to provide nonlinear contact forces as the plunger moves inwardly in relation to the spring finger or fingers. Referring to FIG. 7, there is shown a plunger 18b having a tapered portion which includes bands 34 of increasing taper toward the plunger tip to provide increasing spring force as the plunger is depressed into the spring assembly. An alternative configuration providing nonlinear spring force is shown in FIG. 8, wherein the plunger 18c includes bands 36 of increasing diameter each having a beaded or bulbous configuration 38 to provide axially detented positions, each of increasing spring force as the plunger is depressed. It will be appreciated that the nonlinear forces can be provided for ramped surfaces of faceted or continuous configuration.

Figure 9:
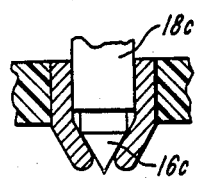
FIG. 9 is a cutaway elevation view of an alternative embodiment in which the plunger is disposed within the spring assembly.

An alternative embodiment is shown in FIG. 9 in which the spring assembly is like that shown in FIG. 6 and in which the plunger 18c is disposed within the contact assembly opposite to the disposition of the FIG. 6 embodiment. The plunger 18c includes a conical end 16c which is cooperative with the ends of the spring fingers of the contact assembly to provide the biasing action to the plunger.

Figure 10:
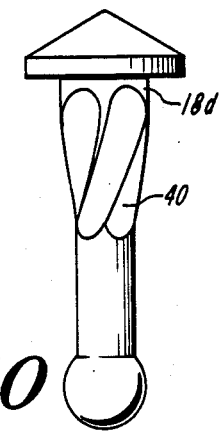
FIG. 10 is an elevation view of a plunger having spiral ramped surfaces.

The contact finger or fingers and/or the cooperative angled surface or surfaces of the plunger can be shaped to provide rotary movement of the plunger about its longitudinal axis along with longitudinal movement of the plunger. An embodiment providing such combined motion is illustrated in FIG. 10 in which the plunger 18d includes faceted surfaces 40 which are spirally disposed and which impart a rotary motion to the plunger as it moves axially in and out of the contact assembly. Such rotary motion is often useful for test probe applications to provide a wiping contact between the probe tip and area of a circuit board or other device being engaged.

Figure 11:
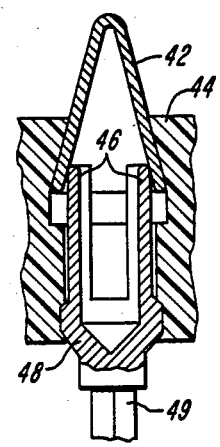
FIG. 11 is a cutaway elevation view of yet another embodiment in which the spring fingers coact within the interior of a ramped structure and are deflectable inward, and shown in its extended position.
Figure 12:
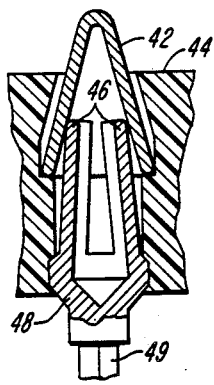
FIG. 12 is a cutaway elevation view of the embodiment of FIG. 11 illustrated in its depressed position.

Another embodiment is shown in FIGS. 11 and 12. A hollow cone 42 is movably disposed within a mounting board 44, the inner conical surface being cooperative with the ends of spring fingers 46, which are part of a spring assembly 48 secured within an opening of the mounting board. An electrical lead 49 outwardly extends from the contact assembly for electrical connection. In the absence of a force applied to the tip of cone 42, the cone is in an extended position as shown in FIG. 11. In the presence of a force applied to the tip, as will occur in use, the cone is driven inward (FIG. 12) against the urging of the spring fingers 46, which are laterally deflected inward and which provide a biasing force to the cone.

It will be appreciated that the cone 42 can in alternative implementation be in a fixed mounted position, with the spring assembly 48 being movable and having a contact tip.

Figure 13:
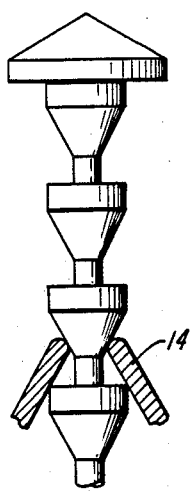
FIG. 13 is a cutaway elevation view of a further plunger configuration having multiple ramped surfaces which are selectively cooperative with a spring assembly.

A further version is shown in FIG. 13 in which the plunger includes along the axis thereof a plurality of conical surfaces, any of which can be cooperative with the spring fingers. The extension of the plunger can be adjusted by depressing the plunger through successive detented positions provided by the respective conical elements until an intended extension is reached. At the intended extension, the conical surface for that position is cooperative with the spring fingers to provide the intended plunger action.

Figure 14:
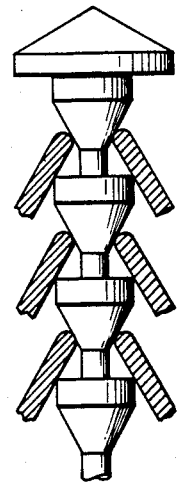
FIG. 14 is a cutaway elevation view of an embodiment using a plunger configuration as in the embodiment of FIG. 13 and with each ramped surface in cooperation with a respective spring assembly.

A further embodiment is shown in FIG. 14 wherein the multiple ramp plunger of FIG. 13 is employed, each ramp being cooperative with spring fingers to provide increased spring bias force. As illustrated, each of the conical surfaces is cooperative with a set of spring fingers which in concert provide an increased force in comparison to that provided by a single set of spring fingers cooperative with a single conical surface.

Figure 16:
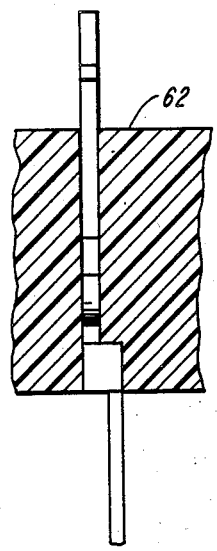
FIG. 16 is a cutaway elevation view illustrating a mounting arrangement for the embodiment of FIG. 15.
Figure 15:
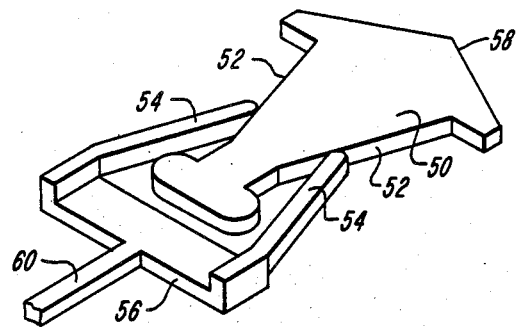
FIG. 15 is a pictorial view of another embodiment of the invention which is of generally planar configuration.

The test probe can also be implemented in a flat configuration such as shown in FIG. 15. The plunger 50 is of generally planar form having a pair of angled surfaces 52 which are cooperative with the laterally deflectable spring fingers 54 of a generally flat spring assembly. The outer end of the plunger terminates in a contact tip 58. A lead 60 extends from the spring assembly for electrical connection. The contact assembly and plunger can be disposed within a sleeve or housing in which the plunger is slidable, or can be contained in a suitable opening provided as a mounting board 62, as shown in FIG. 16. The operation of the probe is as described above.

It will be appreciated that the implementations of the novel test probe can be modified to suit particular operational requirements. The spring fingers of the contact assembly can be provided in a sleeve or can be integral with a sleeve, or can be contained within a mounting opening. The spring fingers can alternatively be part of or integral with the plunger assembly. Various materials can also be employed to suit operational requirements. The sleeve can be of a metal such as beryllium copper. The contact fingers and the plunger can be beryllium or phosphor bronze. Alternatively, the probe can be fabricated of plastic or other non-metal parts, with electrically conductive coatings or layers provided where needed.

The invention is not to be limited by what has been particularly shown and described except as indicated in the appended claims.

What is claimed is:

1. A spring probe comprising:
   a first element having an outer contact tip, an inner end and movable along a longitudinal axis;
   a second element disposed in a mounting member and having an outer end confronting the inner end of the first element;
   one of the elements having a ramp surface;
   the other one of the elements having spring means cooperative with the ramp surface, the spring means being movable in a direction transverse to the axis of the first element and operative to bias the first element to a normally outward axial position;
   means for electrical connection to the second element.

2. A spring probe comprising:
   a spring assembly mountable in an opening of a mounting member and having a spring element deflectable toward and away from an axis of the assembly;
   a plunger having a contact tip on an outer end and a surface inclined from the axis and mountable in engagement with the spring element of the spring assembly;
   the plunger being urged to a normally outward position by the spring action of the spring finger and inclined surface;
   means for electrical connection to the spring assembly.

3. The invention of claim 2 further including means for maintaining the spring assembly and plunger in operative relation.

4. The invention of claim 3 wherein said means for maintaining the spring assembly and plunger in operative relation comprises a sleeve containing the spring assembly and in which the plunger is slidably movable.

5. The invention of claim 4 wherein the spring elements are integrally formed from portions of the sleeve.

6. A spring probe comprising:
   a sleeve;
   a plunger slidable in the sleeve along a longitudinal axis thereof, the plunger having an outer end including a contact tip and an inner end having one or more ramp surfaces inclined with respect to the longitudinal axis;
   one or more spring fingers each having an end engaging a respective ramp surface, the spring fingers being flexible laterally of the longitudinal axis and having a normally inward position to urge the plunger axially outward within the sleeve;
   the spring fingers being operative in response to plunger movement inward of the sleeve to provide a bias force on the plunger which is axially outward to urge the plunger to a normally outward position;
   means for electrical connection to the sleeve.

7. A spring probe comprising:
   a plunger having an inner end and an outer end including a contact tip;
   a spring assembly including a spring finger flexible laterally of the plunger axis;
   a ramp surface on the inner end of the plunger and cooperative with the spring finger to urge the plunger to a normally outward position along the longitudinal axis;
   means for electrical connection to the plunger or assembly.

8. The invention of claim 7 wherein the plunger inner end includes a conical surface cooperative with a plurality of spring fingers of the spring assembly.

9. The invention of claim 7 wherein the plunger inner end includes a plurality of faceted ramp surfaces each cooperative with a spring finger of the spring assembly.

10. The invention of claim 7 wherein the plunger includes a plurality of ramp surfaces each spirally disposed with respect to the longitudinal axis of the plunger and cooperative with the spring fingers to impart a rotary motion to the plunger as it moves along the longitudinal axis.

11. The invention of claim 7 wherein the plunger includes ramp surfaces of increasing taper toward the plunger tip to provide increasing spring force as the plunger is depressed into the spring assembly.

12. The invention of claim 7 wherein the ramp surfaces are of conical configuration disposed in bands which are of increasing taper toward the plunger tip.

13. The invention of claim 7 wherein the bands of increasing taper have a configuration to provide axially detented plunger positions.

14. The invention of claim 7 wherein the plunger is a hollow cone, the inner surface of which provides the ramp surface cooperative with a spring assembly.

15. The invention of claim 7 wherein the plunger includes a plurality of ramp surfaces spaced along the longitudinal axis of the plunger, at least one of the axially positioned ramp surfaces being cooperative with a spring finger of the spring assembly.

16. The invention of claim 7 wherein the plunger includes a plurality of axially spaced ramp surfaces each being cooperative with one or more spring fingers of a spring assembly.

17. A spring probe comprising:
    a hollow cone having a conical inner surface;
    a plunger movable along a longitudinal axis and having an outer contact tip and an inner end containing spring fingers cooperative with the inner conical surface for urging the plunger to a normally outward position along its longitudinal axis;
    means for electrical connection to the core.

18. A spring probe comprising:
    a plunger of generally planar form having a contact tip on an outer end and a pair of angled surfaces near an inner end;
    a generally flat spring assembly having spring fingers engaging the respective angled surfaces of the plunger and a lead outwardly extending from the spring assembly for electrical connection;
    the plunger being urged by the spring fingers and angled surfaces into a normally outward position in the absence of a force applied to the contact tip;
    means for electrical connection to the spring assembly.

19. A spring probe comprising:
    a plunger movable along a longitudinal axis and having a contact tip on an outer end and an inner end;
    an assembly disposed in cooperation with the plunger;
    the plunger inner end and confronting portion of the assembly having at least one ramp surface and at least one spring finger laterally deflectable and cooperative with the ramp surface to urge the plunger into a normally outward position along its longitudinal axis;
    means for electrical connection to the assembly.

* * * * *